United States Patent
Wang

(10) Patent No.: US 7,671,422 B2
(45) Date of Patent: Mar. 2, 2010

(54) PSEUDO 6T SRAM CELL

(75) Inventor: Ping-Wei Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/865,950

(22) Filed: Oct. 2, 2007

(65) Prior Publication Data

US 2008/0273382 A1 Nov. 6, 2008

Related U.S. Application Data

(60) Provisional application No. 60/927,740, filed on May 4, 2007.

(51) Int. Cl.
*H01L 23/62* (2006.01)
(52) U.S. Cl. .................. 257/369; 257/903; 257/906; 257/E27.098; 365/51; 365/156; 365/230.5
(58) Field of Classification Search ......... 257/369–371, 257/903, 906, E27.098, 368; 365/154, 181, 365/51, 63, 156, 230.05
See application file for complete search history.

(56) References Cited

U.S. PATENT DOCUMENTS

| | | | |
|---|---|---|---|
| 4,623,989 A * | 11/1986 | Blake | 365/156 |
| 5,710,742 A | 1/1998 | Carter et al. | |
| 5,734,187 A | 3/1998 | Bohr et al. | |
| 6,091,629 A | 7/2000 | Osada et al. | |
| 6,285,604 B1 | 9/2001 | Chang | |
| 6,341,083 B1 | 1/2002 | Wong | |
| 6,542,401 B2 | 4/2003 | Yamauchi et al. | |
| 6,618,302 B2 | 9/2003 | Terzioglu et al. | |
| 6,864,519 B2 * | 3/2005 | Yeo et al. | 257/206 |
| 6,917,560 B2 | 7/2005 | Nii | |
| 2002/0174298 A1 | 11/2002 | Hsu et al. | |
| 2005/0111251 A1 * | 5/2005 | Liaw | 365/154 |
| 2006/0092701 A1 | 5/2006 | Horiuchi | |

OTHER PUBLICATIONS

Van Der Wagt, J.P.A., "Tunneling-Based SRAM," Proceedings of the IEEE, vol. 87, No. 4, Apr. 1999, pp. 571-595.

* cited by examiner

*Primary Examiner*—Thinh T Nguyen
(74) *Attorney, Agent, or Firm*—Slater & Matsil, L.L.P.

(57) ABSTRACT

A pseudo 6T SRAM cell design comprising eight transistors is provided. An embodiment comprises a pair of cross-coupled inverters and a pair of pass-gate transistors electrically coupled to each inverter through the substrate. Each pass-gate transistor has a different beta ratio from the other transistor in its pair, and the smaller beta ratio in the pair acts as a "read" port while the larger beta ratio in the pair acts as a "write" port. Two pairs of bit lines are connected to the pass-gate transistors. A variety of word lines are connected to the pass-gate transistors. In one embodiment, a single word line is connected to all of the pass-gate transistors. In another embodiment, a pair of word lines is connected to the pass-gate transistors. In yet another embodiment, a different word line is connected to each pass-gate transistor.

20 Claims, 8 Drawing Sheets

PSEUDO 6T SRAM CELL

This application claims the benefit of U.S. Provisional Application No. 60/927,740, filed on May 4, 2007, entitled "Pseudo 6T SRAM Cell," which application is hereby incorporated herein by reference.

TECHNICAL FIELD

The present invention relates generally to semiconductor devices and more particularly to a system for a memory cell structure.

BACKGROUND

Complementary metal-oxide semiconductor (CMOS) technology is the dominant semiconductor technology used for the manufacture of static random access memory cells (SRAM). The reduction in size of SRAM cells has provided significant improvements in the speed, performance, circuit density, and cost per unit function of SRAM cells. However, as these memory cells are reduced in size, increases in the write margin, increases in the read margin, and reductions in the minimum operation voltage ($V_{cc,min}$) of the memory cell become more critical to its efficient operation.

FIG. 1 shows an eight-transistor (8T) SRAM memory cell 100. This 8T memory cell 100 has a first pass-gate transistor 101, a second pass-gate transistor 103, a third pass-gate transistor 115, a fourth pass-gate transistor 117, a first pull-up transistor 105, a second pull-up transistor 107, a first pull-down transistor 109, and a second pull-down transistor 111. In the 8T memory cell 100, the gates 113 of the pass-gate transistor 101 and the pass-gate transistor 115 are controlled by the first word line WL-1 and the gates 121 of the pass-gate transistor 103 and the pass-gate transistor 117 are controlled by the second word line WL-2 to determine whether the 8T memory cell 100 is selected or not selected. A latch formed of pull-up transistors 105 and 107 and pull-down transistors 109 and 111 stores a state. The stored state can be read through the bit line combination ABL/ABLB or the bit line combination BBL/BBLB.

In this configuration, the 8T memory cell 100 is written to by putting a low voltage on the first word line WL-1 while putting a high voltage on the second word line WL-2. Once a high voltage has been put onto the second word line WL-2, a high voltage is placed on the bit line BBL and complementary bit line BBLB, while keeping a low voltage on the bit line ABL and complementary bit line ABLB. To read from this memory device, a high voltage is put onto the first word line WL-1 and a low voltage is placed onto the second word line WL-2. Once a high voltage is placed onto the first word line WL-1, a high voltage is placed onto the bit line ABL and its complementary bit line ABLB while a low voltage is placed onto the bit line BBL and its complementary bit line BBLB.

FIG. 2 is an overlay view of the design of the 8T memory cell 100. This shows the inherent drawback to the 8T memory cell 100: its size. The 8T memory cell takes up considerably more space than a typical 6T memory cell. A typical 6T memory cell uses about 0.35 µm² while the 8T memory cell 100 uses about 0.65 µm².

What is needed, therefore, is a memory cell with eight transistors that has an improved read margin, an improved write margin, and a reduced $V_{cc,min}$, that also has a reduced area.

SUMMARY OF THE INVENTION

These and other problems are generally solved or circumvented, and technical advantages are generally achieved, by preferred embodiments of the present invention that allow for a SRAM memory cell.

One aspect of the present invention includes a semiconductor device comprising a substrate, a first pull-up transistor electrically coupled to a first pull-down transistor and a second pull-up transistor electrically coupled to a second pull-down transistor. These transistors are cross coupled such that the output from the first pull-down and first pull-up transistors are connected to the gates of the second pull-up and pull-down transistors, and that the output from the second pull-down and second pull-up transistors are connected to the gates of the first pull-up and first pull-down transistors. There are also four pass-gate transistors, with two of the pass-gate transistors being electrically connected in parallel through the substrate to the drain of the first pull-down transistor. The other two pass-gate transistors are connected in parallel through the substrate to the drain of the second pull-down transistor. The two pass-gate transistors connected to the first pull-down transistor have different beta ratios from each other, and the two pass-gate transistors connected to the second pull-down transistors have different beta ratios from each other.

Another aspect of the present invention includes a SRAM cell comprising a substrate, a pair of cross-coupled inverters, a first and second read port, and a first and second write port. The substrate has four active areas on it, wherein the first and third active areas each have a wide area and two protrusions extending from the wide areas along a line that is substantially parallel to the longitudinal axis of the second and fourth active areas, respectively. The first read port is electrically coupled through a plug to a first bit line and electrically coupled through the substrate to the first inverter. The second read port is electrically coupled through a plug to a first complementary bit line and electrically coupled through the substrate to the second inverter. The first write port is electrically coupled through a plug to a second bit line and electrically coupled through the substrate to the first inverter. The second write port is electrically coupled through a plug to a second complementary bit line and electrically coupled through the substrate to the second inverter. The first write port and second write ports have larger beta ratios than the first read port and second read port, respectively.

Another aspect of the present invention includes a semiconductor memory circuit comprising a plurality of memory cells. Each memory cell would have a substrate and a pair of cross-coupled inverters. Four pass-gate transistors are connected in pairs to the inverters, such that the pass-gate transistors are electrically connected to the inverters through the substrate. Separate word lines are connected to each of the pass-gate transistors. A first bit line is connected to one of the pass-gate transistors connected to the first inverter, and a second bit line is connected to the other pass-gate transistor connected to the first inverter. A first complementary bit line is connected to one of the pair of pass-gate transistors connected to the second inverter, and a second complementary bit line is connected to the other of the pair connected to the second inverter.

As one who is skilled in the art will recognize, this invention will allow for an increase in the read margin and the write margin without a corresponding increase in the surface area of the cell itself. This will, accordingly, reduce the $V_{cc,min}$ necessary to operate the cell.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to a specific embodiment, specifically a pseudo 6T SRAM memory cell. Embodiments of the present invention, however, may be used to form other types of memory cells.

Figure 1:
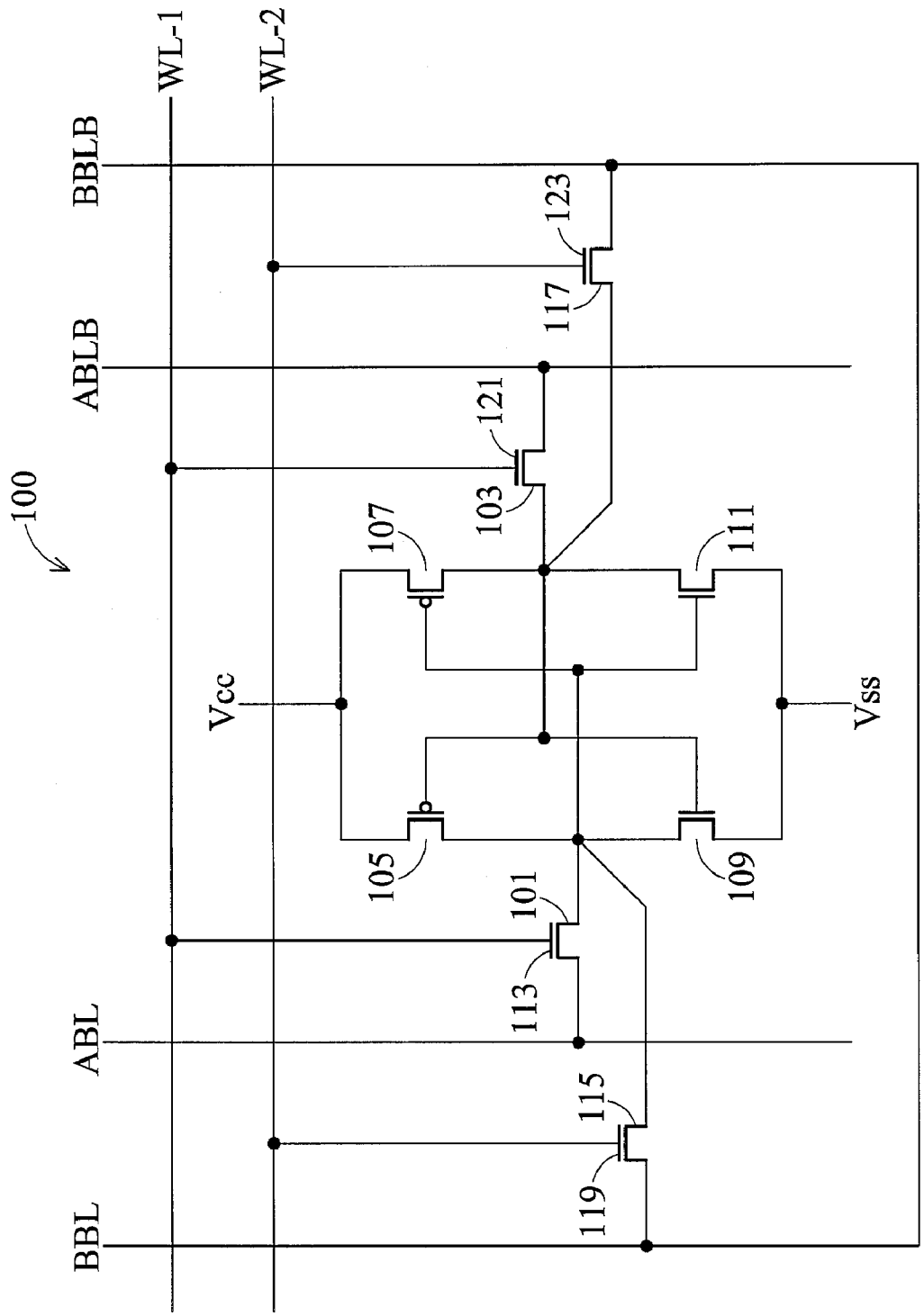
FIG. 1 is a schematic diagram of an 8T SRAM memory cell in the prior art.
Figure 2:
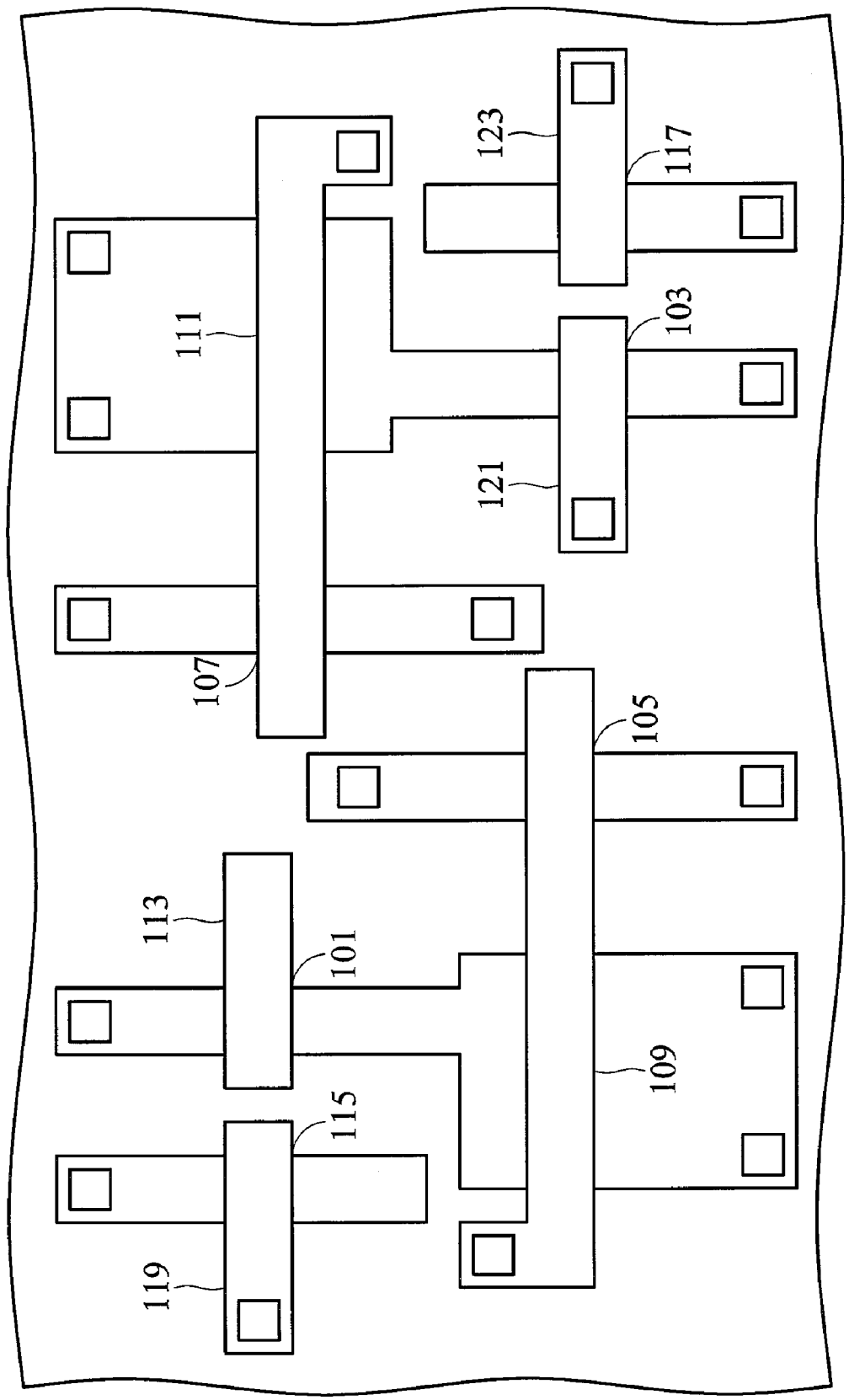
FIG. 2 is a layout view of the 8T SRAM memory cell in the prior art described in FIG. 1.
Figure 3:
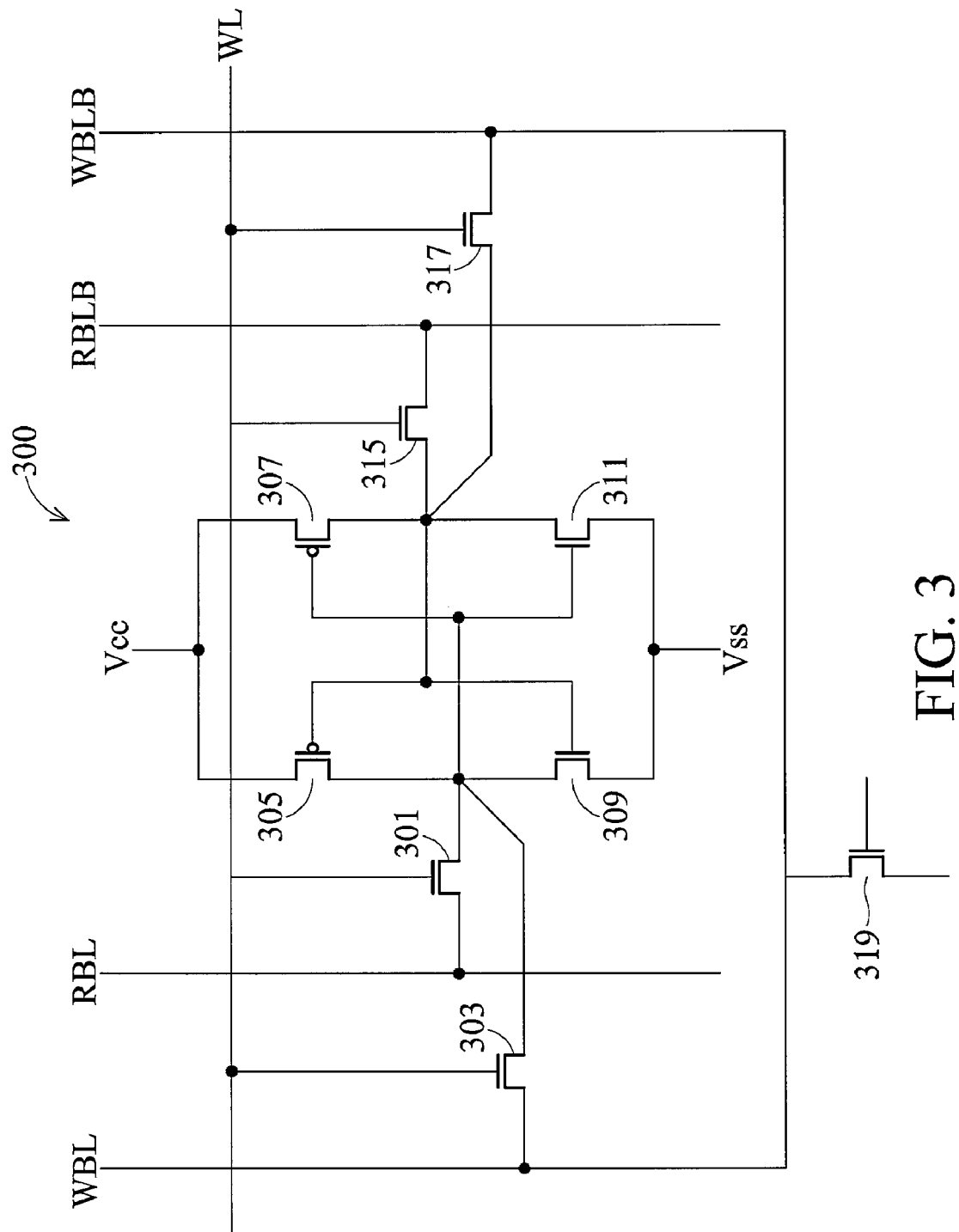
FIG. 3 is a schematic diagram of a pseudo 6T SRAM cell where all of the pass-gate transistors are connected to the same word line, in accordance with an embodiment of the present invention.

FIG. 3 is a schematic diagram of a memory device 300, in accordance with an embodiment of the present invention. A first pull-up transistor 305, a first pull-down transistor 309, a second pull-up transistor 307, and a second pull-down transistor 311 are electrically connected to form two cross-coupled inverters. The drains of the first pull-down transistor 309 and the first pull-up transistor 305 are electrically connected to the gates of the second pull-up transistor 307 and the second pull-down transistor 311, and the drains of the second pull-up transistor 307 and the second pull-down transistor 311 are electrically connected to the gates of the first pull-up transistor 305 and the first pull-down transistor 309.

The memory device 300 also consists of a first pass-gate transistor 301, a second pass-gate transistor 315, a third pass-gate transistor 303, and a fourth pass-gate transistor 317, for a total of four pass-gate transistors. The gates of all the pass-gate transistors are connected to a single word line WL that controls access to the memory cell 300 in order to read or write to the memory cell (these functions are described below). The first pass-gate transistor 301 is connected to a read bit line (RBL), the second pass-gate transistor 315 is connected to a complementary read bit line (RBLB), the third pass-gate transistor 303 is connected to a write bit line (WBL), and the fourth pass-gate transistor 317 is connected to a complementary write bit line (WBLB). The first pass-gate transistor 301 and the third pass-gate transistor 303 are connected to a common node with the first pull-down transistor 309 and the first pull-up transistor 305. The second pass-gate transistor 315 and the fourth pass-gate transistor 317 are connected to a common node with the second pull-down transistor 311 and the second pull-up transistor 307.

Optionally, a first write transistor 319 could be electrically coupled to the write bit line WBL and the complementary write bit line WBLB. This first write transistor 319 could be used to control the write bit line WBL and the complementary write bit line WBLB during the read and write operations for the memory cell 300.

Figure 4:
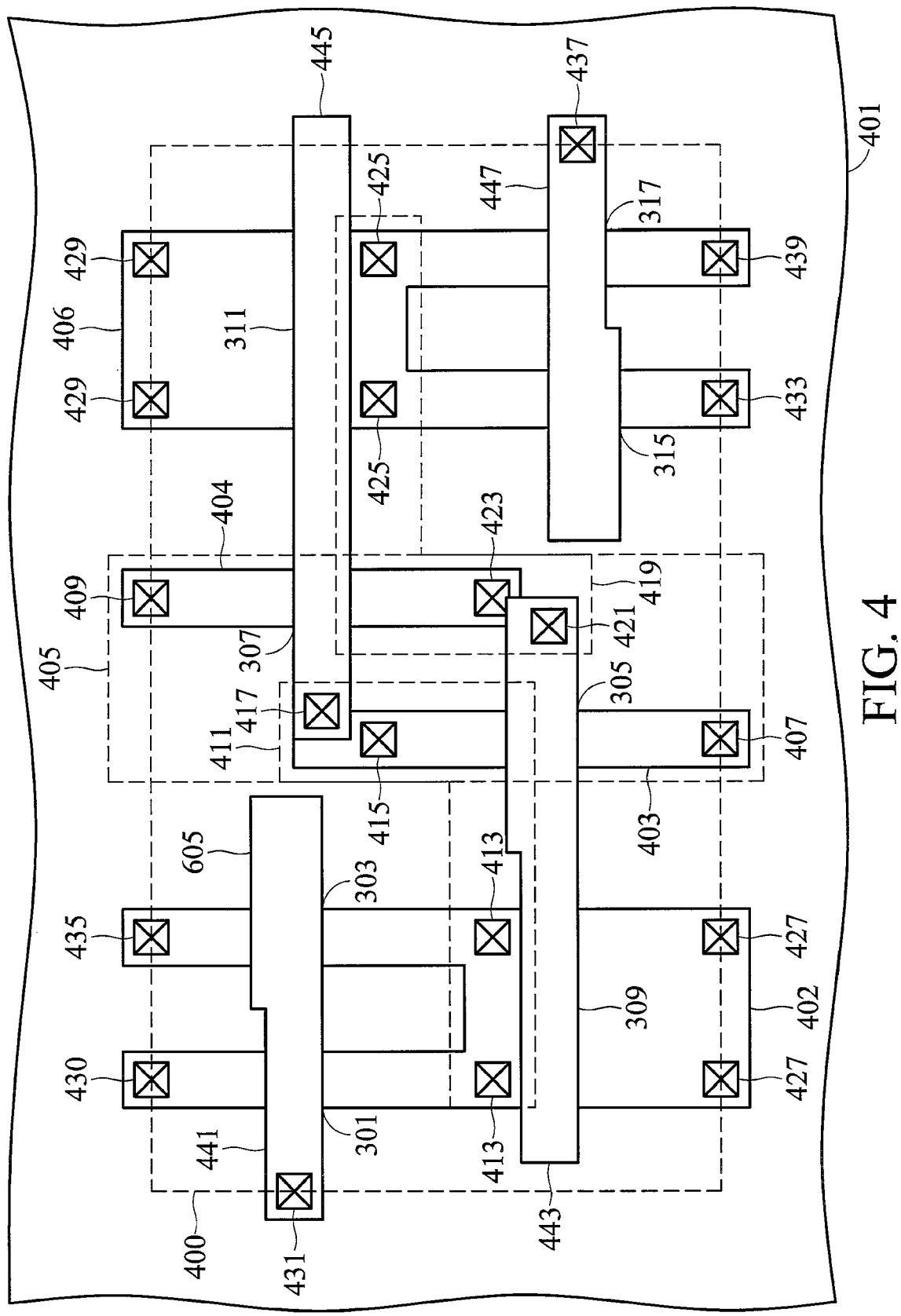
FIG. 4 is a layout view of the pseudo 6T SRAM cell illustrated in FIG. 3 in accordance with an embodiment of the present invention.

FIG. 4 is an overlay view of the memory device 300 illustrated in FIG. 3 in accordance with an embodiment of the present invention. A dotted line 400 running through the sources of the transistors and the plugs of the gate electrodes in FIG. 4 represents a unit cell or the boundary of a single memory cell 300 illustrated in FIG. 3. It should be noted that the boundary may not be readily apparent in a finished product. Rather, the unit cell 400 defines the basic building block for designing memory arrays. Memory devices typically have one or more memory arrays. The unit cell 400 may be duplicated any number of times (e.g., thousands, millions, billions, trillions, or more) to create memories capable of storing various amounts of data.

The unit cell 400 is formed on a substrate 401. The substrate 401 may comprise bulk silicon, doped or undoped, or an active layer of a silicon on insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Preferably, the substrate 401 is a p-type substrate, although in other embodiments, it could be an n-type substrate.

An n-well 405 is located within the substrate 401, as shown in FIG. 4, with the p-type substrate 401 on opposing sides of the n-well 405. The n-well 405 may alternatively be a deep n-well, for example. The n-well 405 is formed on the substrate 401 by performing an implant with n-type ions such as phosphorous, as is known in the art. However, other n-type ions such as nitrogen, arsenic, or antimony could alternatively be used.

A first PMOS active area 403 and a second PMOS active area 404 are formed within the n-well 405 and will include source and drain regions of the first pull-up transistor 305 and the second pull-up transistor 307. One of ordinary skill in the art will realize that active areas are separated by isolation regions, such as shallow trench isolations (STIs). Generally, the STIs are formed by etching the substrate 401 around the active areas to form trenches and filling the trenches with a dielectric material as is known in the art. Preferably, the trenches are filled with a dielectric material such as an oxide material, a high-density plasma (HDP) oxide, or the like, formed by conventional methods known in the art. However, other types of isolation structures could alternatively be used to isolate the active areas.

As shown in FIG. 4, a first NMOS active area 402 and a second NMOS active area 406 are located in the substrate 401 on opposite sides of the n-well 405. The first NMOS active area 402 is shaped with a wide area on which a first pull-down transistor 309 is formed. This wide area for the first pull-down transistor 309 may be formed to a width of between about 0.1 µm and about 1 µm, with a preferable width of 0.4 µm, and a length of between about 0.04 µm and about 0.08 µm, with a preferable length of 0.05 µm. Extending from this wide area of the first NMOS active area 402 are two protrusions that run substantially parallel to a longitudinal axis of the first PMOS active area 403. A first pass-gate transistor 301 is formed on one protrusion and a third pass-gate transistor 303 is formed on the other protrusion. These protrusions may have a length of between about 0.04 µm and 0.1 µm, with a preferable length of 0.065 µm. The width of these protrusions is preferably between about 0.06 µm and about 0.5 µm. The length and width of the channel region of the first pass-gate transistor 301 and the third pass-gate transistor 303 are designed so as to control the beta ratios of the transistors (discussed below with respect to the individual pass-gate transistors).

The second NMOS active area 406 is also shaped with a wide area on which a second pull-down transistor 311 will be formed. This wide area for the second pull-down transistor 311 may be formed to a width similar to the first pull-down transistor 309 of between about 0.1 µm and about 1 µm, with a preferable width of 0.4 µm, and a length of between about 0.04 µm and about 0.08 µm, with a preferable length of 0.05 µm. Extending from this wide area of the second NMOS active area 406 are two protrusions that run substantially parallel to a longitudinal axis of the second PMOS active area 404, but in a substantially opposite direction from the protrusions of the first NMOS active area 402. A second pass-gate transistor 315 is formed on one protrusion and a fourth pass-gate transistor 317 is formed on the other protrusion of the second NMOS active area 406. These protrusions may have a length of between about 0.04 µm and 0.1 µm, with a preferable length of 0.065 µm. The width of these protrusions is preferably between about 0.06 µm and about 0.5 µm. The length and width of the second pass-gate transistor 315 and the fourth pass-gate transistor 317 are designed so as to control the beta ratios of the transistors (discussed below with respect to the individual pass-gate transistors).

As one of skill in the art will realize, the dimensions as described above are merely meant to illustrate a particular embodiment of the present invention. Specifically, the dimensions as described above relate to a 45 nm generation transistor. However, the above description is not meant to limit the present invention, and other dimensions could also be used depending in other generations of transistors, especially as the size of transistors is reduced in subsequent generations of transistors.

The relative widths of the protrusions in relation to the wide area of the first NMOS active area 402 allow the first pass-gate transistor 301 and the third pass-gate transistor 303 to connect to the first pull-down transistor 309 through the first NMOS active area 402 on the substrate 401. Similarly, the widths of the protrusions in relation to the wide area of the second NMOS active area 406 allow the second pass-gate transistor 315 and the fourth pass-gate transistor 317 to connect to the second pull-down transistor 311 through the second NMOS active area 406 on substrate 401. By using this connection through the substrate 401, there is no requirement for connections through extra metal layers and interconnects.

A first gate electrode 441 is formed over an area of the protrusions of the first NMOS active area 402 to form the gates of the first pass-gate transistor 301 and the third pass-gate transistor 303. A second gate electrode 443 is formed over the a portion of the wide area of the first NMOS active area 402 and a portion of the first PMOS active area 403 to form the gates for the first pull-down transistor 309 and the first pull-up transistor 305. A third gate electrode 445 is formed over a portion of the wide area of the second NMOS active area 406 and a portion of the second PMOS active area 404 to form the gate of the second pull-up transistor 307 and the gate of the second pull-down transistor 311. A fourth gate electrode 447 is formed over parts of the protrusions of the second NMOS active area 406 to form the gate of the second pass-gate transistor 315 and the fourth pass-gate transistor 317.

The gate electrodes 441, 443, 445, 447 of the first embodiment comprise one or more conductive layers such as a doped polysilicon, metal, metal alloy, combinations thereof, or the like. The gate electrodes have a thickness that is less than about 2,000 Å, and more preferably less than about 1,000 Å. The lengths of the gate electrodes (and, consequently, the length of the channel beneath the gate electrodes) are preferably between about 10 nm and about 110 nm, with a preferred length of about 25 nm to 65 nm. However, if an unconventional transistor, such as a FinFET transistor, is to be utilized, then the length of the gate electrodes may be significantly smaller, such as between about 5 nm and about 45 nm, with a preferred length of about 10 nm to 40 nm.

A gate dielectric (not shown) is interposed between the gate electrodes 441, 443, 445, 447 and the substrate 401. The gate dielectrics have a thickness that is preferably less than about 50 Å, and more preferably less than about 20 Å. The gate dielectrics may be a single layer or may have multiple layers comprising a plurality of dielectric materials. At least one layer preferably comprises $SiO_2$, nitrided oxide, a nitrogen-containing oxide, SiON, a metal oxide, a high-K dielectric, combinations thereof, or the like.

As shown in FIG. 4, the source of the first pull-up transistor 305 is electrically coupled with a voltage source $V_{cc}$ through plug 407, and the source of the second pull-up transistor 307 is electrically coupled to a voltage source $V_{cc}$ through plug 409. The source of the first pull-down transistor 309 is electrically coupled to a ground $V_{ss}$ via two plugs 427, and the drain of the first pull-down transistor 309 is electrically coupled through the first NMOS active area 402 in the substrate 401 to the drain of the first pass-gate transistor 301 and the drain of the third pass-gate transistor 303. The source of the second pull-down transistor 311 is electrically coupled to a ground $V_{ss}$ via two plugs 429, and the drain of the second pull-down transistor 311 is electrically coupled through the second NMOS active area 406 in the substrate 401 to the drain of the second pass-gate transistor 315 and the drain of the fourth pass-gate transistor 317.

The source of the first pass-gate transistor 301 is electrically coupled to the read bit line RBL via a plug 430. The first pass-gate transistor 301 electrically couples the read bit line RBL to the drain of the first pull-down transistor 309 through the first NMOS active area 402 in the substrate 401. The gate 441 of the first pass-gate transistor 301 is electrically coupled to the word line via a plug 431.

The dimensions of the channel of the first pass-gate transistor 301 are also controlled so that the first pass-gate transistor 301 has a beta ratio β1 that is less than the beta ratio β3 of the third pass-gate transistor 303. The beta ratio β1 of the first pass-gate transistor 301 is the ratio of the conductance of the first pull-down transistor 309 to the conductance of the first pass-gate transistor 301, and the beta ratio β3 of the third pass-gate transistor 303 is the ratio of the conductance of the first pull-down transistor 309 to the conductance of the third pass-gate transistor 303. The conductance of the devices can be approximated by the effective carrier mobility ($\mu_{eff}$) of the device times the ratio of the length of the channel (L) over the width of the channel, or $\mu_{eff}(L/W)$. Accordingly, if the length or width of the first pass-gate transistor 301 is varied, the beta ratio β1 of the first pass-gate transistor 301 will be varied accordingly. In this embodiment the beta ratio β1 of the first pass-gate transistor 301 is controlled such that it is less than the beta ratio β3 of the third pass-gate transistor 303. Because of its smaller beta ratio β1 the first pass-gate transistor 301 can be used as a read port of the memory cell 300 during read operations.

With further reference to the electrical connectivity of the first embodiment shown in FIG. 4, the source of the second pass-gate transistor 315 is electrically coupled to the complementary read bit line RBLB via a plug 433. The second pass-gate transistor 315 electrically couples the read bit line RBLB to the drain of the second pull-down transistor 311 through the second NMOS active area 406 in the substrate 401. The gate 447 of the second pass-gate transistor 315 is electrically coupled to the word line via a plug 437. As described above with reference to the first pass-gate transistor 301, the dimensions of the channel of the second pass-gate transistor 315 can be varied to create a beta ratio β2 which is the ratio of the conductance of the second pull-down transistor 311 to the conductance of the second pass-gate transistor 315. In this embodiment the beta ratio β2 of the second pass-gate transistor 315 is less than the beta ratio β4 of the fourth pass-gate transistor 317. Because of its smaller beta ratio β2 the second pass-gate transistor 315 can be used as a read port of the memory cell 300 during read operations.

With further reference to the electrical connectivity of the first embodiment shown in FIG. 4, the source of the third pass-gate transistor 303 is electrically coupled to the write bit line WBL via a plug 435. The third pass-gate transistor 303 electrically couples the write bit line WBL to the drain of the first pull-down transistor 309 through the first NMOS active area 402 in the substrate 401. The gate 441 of the third pass-gate transistor 303 is electrically coupled to the word line via a plug 431. As described above with reference to the first pass-gate transistor 301, the dimensions of the channel of the third pass-gate transistor 303 can be varied to create a beta ratio β3 of the third pass-gate transistor 303 that is greater than the beta ratio β1 of the first pass-gate transistor 301. Because of its greater beta ratio β3 the third pass-gate transistor 303 can be used as a write port of the memory cell 300 during writing operations.

With further reference to the electrical connectivity of the first embodiment shown in FIG. 4, the source of the fourth pass-gate transistor 317 is electrically coupled to the complementary write bit line WBLB via a plug 439. The fourth pass-gate transistor 317 electrically couples the complementary write bit line WBLB to the drain of the second pull-down transistor 311 through the second NMOS active area 406 in the substrate 401. The gate 447 of the fourth pass-gate transistor 317 is electrically coupled to the word line via a plug 437. As described above with reference to the first pass-gate transistor 301, the dimensions of the channel of the fourth pass-gate transistor 317 can be varied to create a beta ratio β4 of the fourth pass-gate transistor 317 that is greater than the beta ratio β2 of the second pass-gate transistor 317. Because of its greater beta ratio β4 the fourth pass-gate transistor 317 can be used as a write port of the memory cell 300 during writing operations.

The source of the first pull-up transistor 305 and the source of the second pull-up transistor 307 are electrically coupled to a voltage source $V_{cc}$ via plugs 407 and 409, respectively. The drain of the first pull-up transistor 305, the drain of the first pull-down transistor 309, the drain of the first pass-gate transistor 301, the drain of the third pass-gate 303 and the gates 445 of the second pull-up transistor 307 and the second pull-down transistor 311 are electrically coupled via an intra-cell connection 411 and plugs 413, 415, and 417. Similarly, the drain of the second pull-up transistor 307, the drain of the second pull-down transistor 311, the drain of the second pass-gate transistor 315, the drain of the fourth pass-gate transistor 317, and the gates 443 of the first pull-up transistor 305 and the first pull-down transistor 309 are electrically coupled via an intra-cell connection 419 and plugs 421, 423, and 425. The intra-cell connections are preferably comprised of copper but optionally may be W, an Al/Cu alloy, Al, a refractory metal or metal compound, a metal silicide, combinations thereof, and the like.

In the embodiment illustrated by FIGS. 3 and 4, the memory device 300 is written to by applying a high voltage to the word line WL to turn on the first pass-gate transistor 301, the second pass-gate transistor 315, the third pass-gate transistor 303, and the fourth pass-gate transistor 317. With all of the pass-gate transistors open, the write bit line WBL, the complementary write bit line WBLB, the read bit line RBL and the complementary read bit line WRBL can all be used to write to the memory device 300.

To read from this embodiment, a high voltage is applied to the word line WL to turn on the first pass-gate transistor 301, the second pass-gate transistor 315, the third pass-gate transistor 303, and the fourth pass-gate transistor 317. With all of the pass-gate transistors open, the read bit line RBL and the complementary read bit line RBLB can be used to read the memory device 300. The write bit line WBL and complementary write bit line WBLB may or may not be used to read from the memory device 300 in this embodiment.

Figure 5:
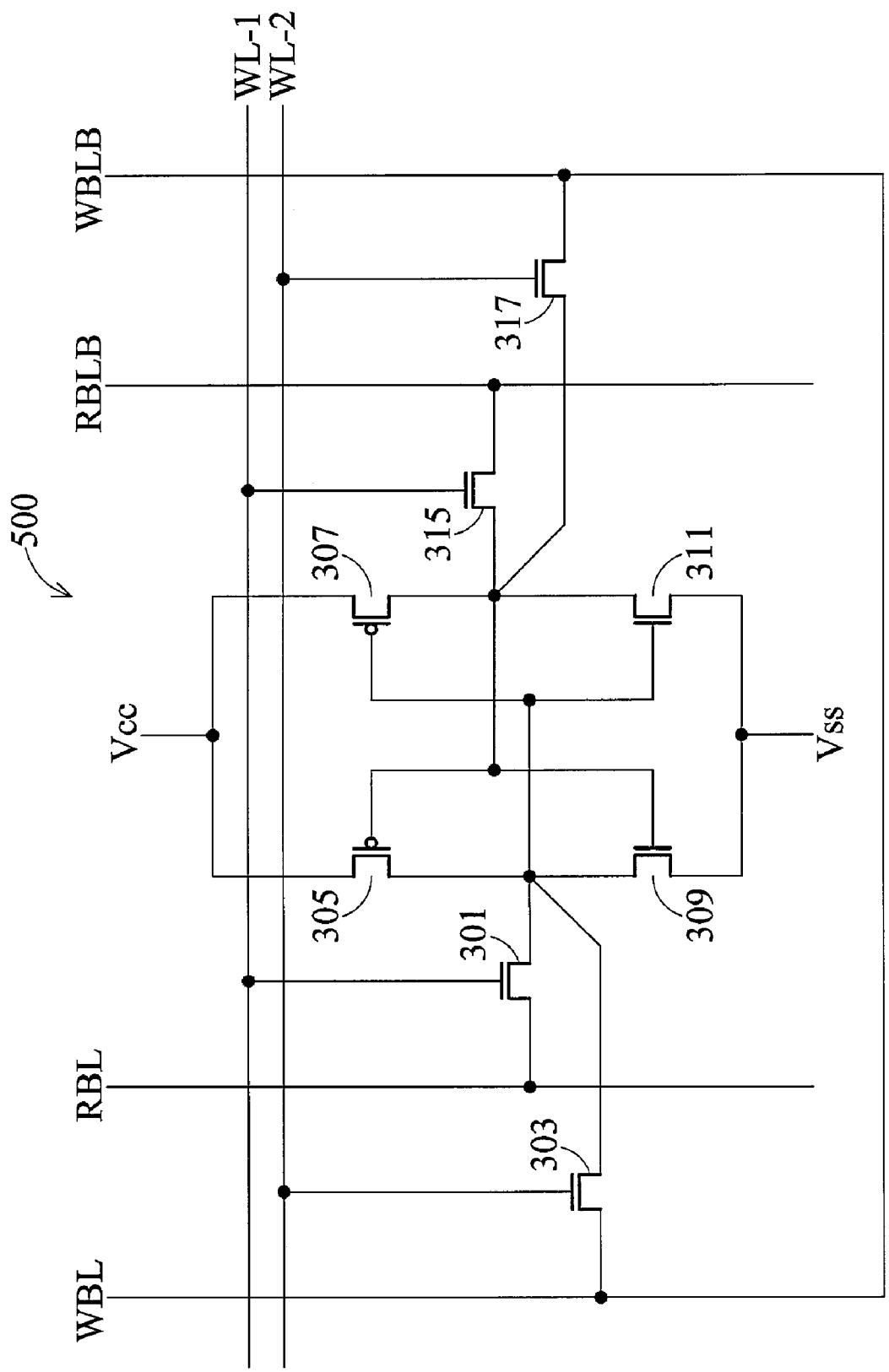
FIG. 5 is a schematic diagram of a pseudo 6T SRAM cell where the first pass-gate transistor and the second pass-gate transistor are connected to a first word line, and the third pass-gate transistor and the fourth pass-gate transistor are connected to a second word line, in accordance with an embodiment of the present invention.

FIG. 5 illustrates a schematic diagram of a pseudo 6T SRAM memory device 500 in accordance with a second embodiment of the present invention. In this embodiment the gates of the first pass-gate transistor 301 and the second pass-gate transistor 315 are electrically coupled to the same word line WL-1, and the gates of the third pass-gate transistor 303 and the fourth pass-gate transistor 317 are electrically coupled to the same word line WL-2.

Figure 6:
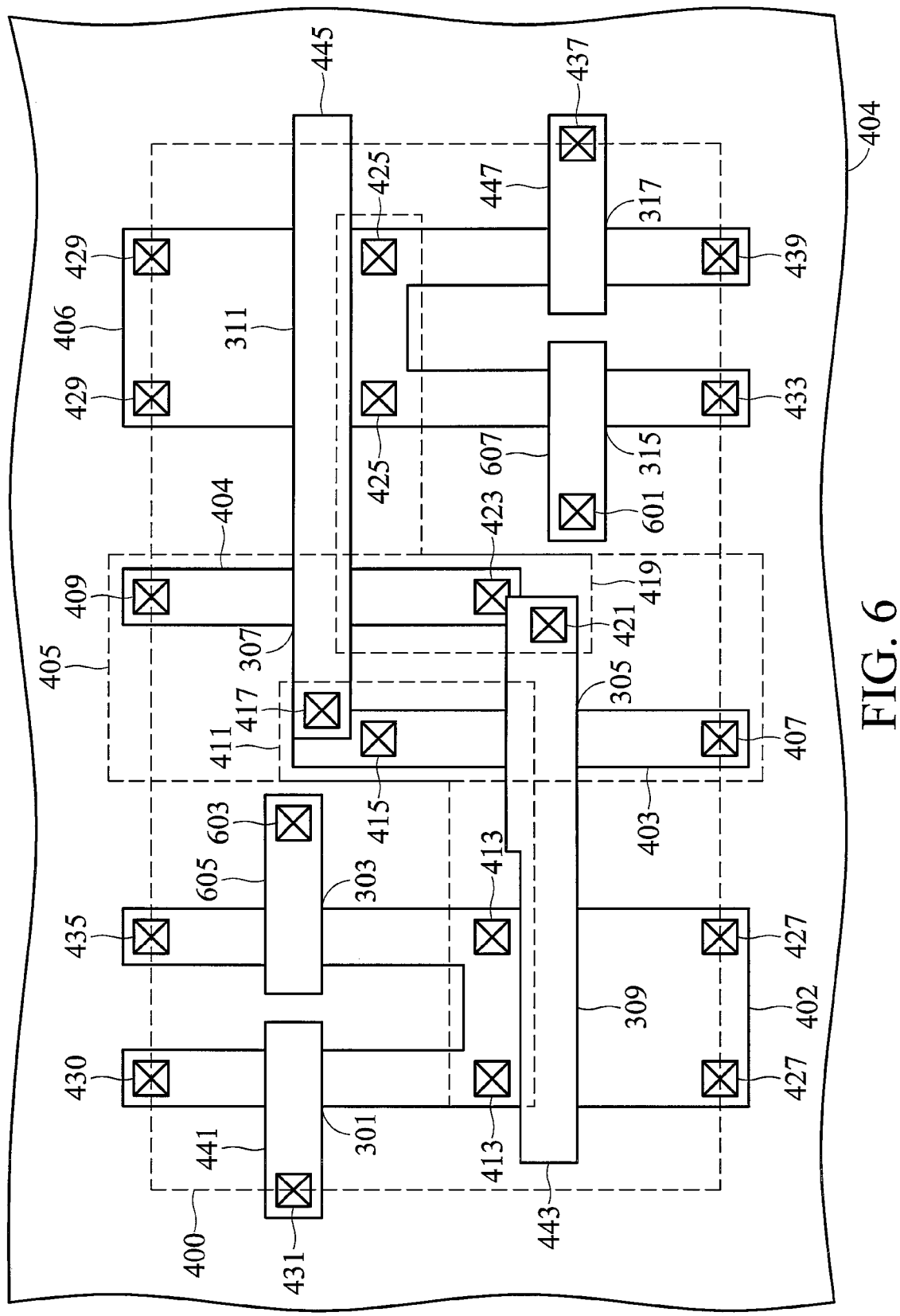
FIG. 6 is a layout view of the pseudo 6T SRAM cell illustrated in FIG. 5 in accordance with an embodiment of the present invention.

FIG. 6 illustrates an overlay view of the second embodiment illustrated in FIG. 5 in accordance with an embodiment of the present invention. The overall layout and formation of this embodiment is similar to the layout of the embodiment described above with reference to FIGS. 3 and 4. However, in this embodiment, the first pass-gate transistor 301 and the third pass-gate transistor 303 do not share a common gate, and the second pass-gate transistor 315 and the fourth pass-gate transistor 317 do not share a common gate. Rather each of the first pass-gate transistor 301, the second pass-gate transistor 315, the third pass-gate transistor 303, and the fourth pass-gate transistor 317 have distinct gates 441, 607, 605, and 437, respectively. The gate 441 of the first pass-gate transistor 301 is connected to the word line WL-1 through a plug 431, and the gate 607 of the second pass-gate transistor 315 is connected to the same word line WL-1 through a plug 601. Further, the gate 605 of the third pass-gate 303 is connected to the word line WL-2 through a plug 603, and the gate 447 of the fourth pass-gate transistor 317 is connected to the same word line WL-2 through a plug 437.

Figure 7:
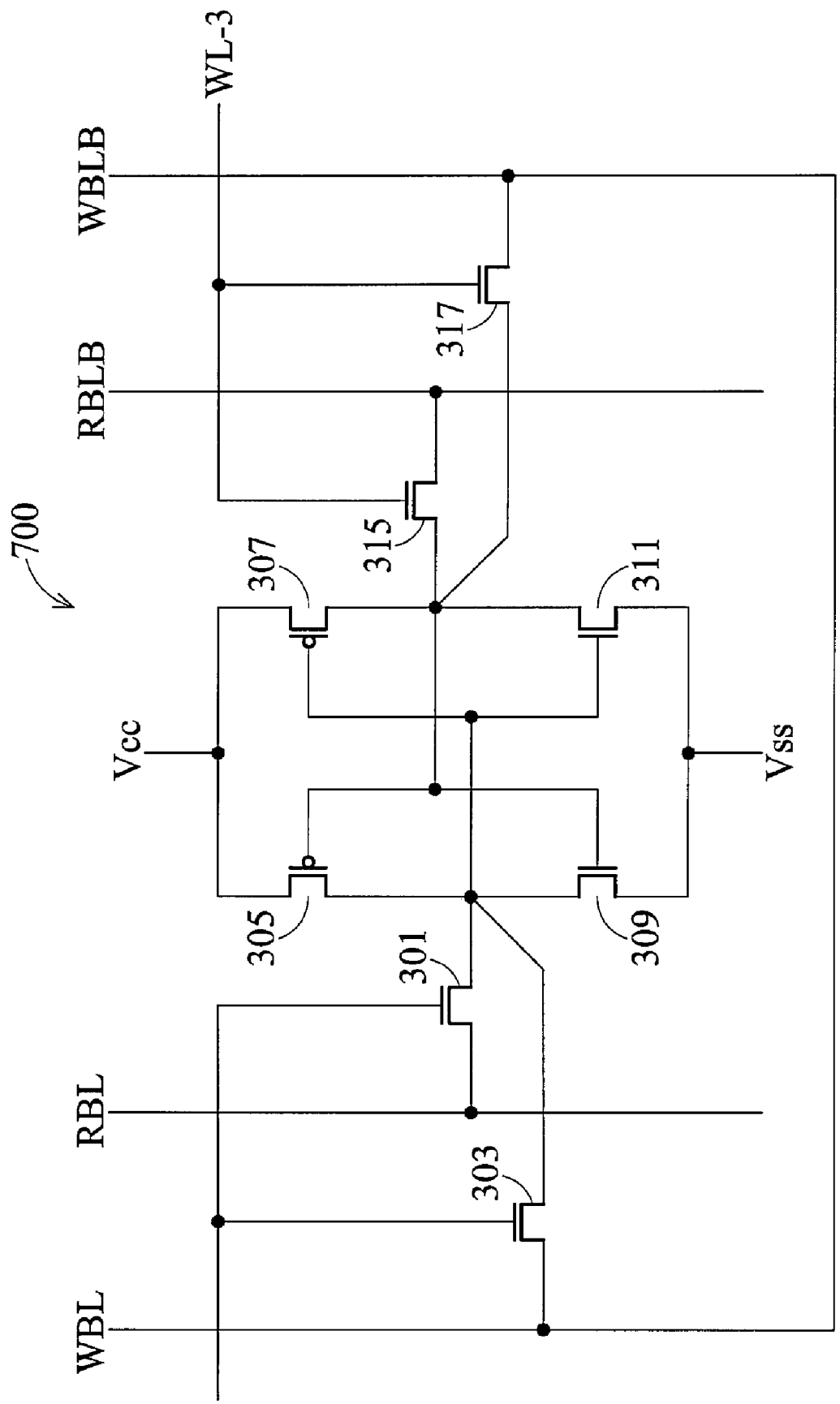
FIG. 7 is a schematic diagram of a pseudo 6T SRAM in which the first and third pass-gate transistors are connected to a first word line, and the second and fourth pass-gate transistors are connected to a second word line in accordance with an embodiment of the present invention.

FIG. 7 is a schematic diagram of a pseudo 6T SRAM memory cell 700, in accordance with a third embodiment of the present invention. In this embodiment the first pass-gate transistor 301 and the third pass-gate transistor 303 are electrically connected to the same word line WL-3. The second pass-gate transistor 315 and the fourth pass-gate transistor 317 are electrically connected to the same word line WL-4 (but a different word line than WL-3).

The overlay view of this memory cell 700 is similar to FIG. 4, except that in this embodiment the gate 441 of the first pass-gate transistor 301 and the gate 441 of the third pass-gate transistor 303 are connected to the word line WL-1 through a plug 431, and the gate 447 of the second pass-gate transistor 315 and the gate 447 of the fourth pass-gate transistor 317 are connected to the same word line WL-2 through a plug 437.

Figure 8:
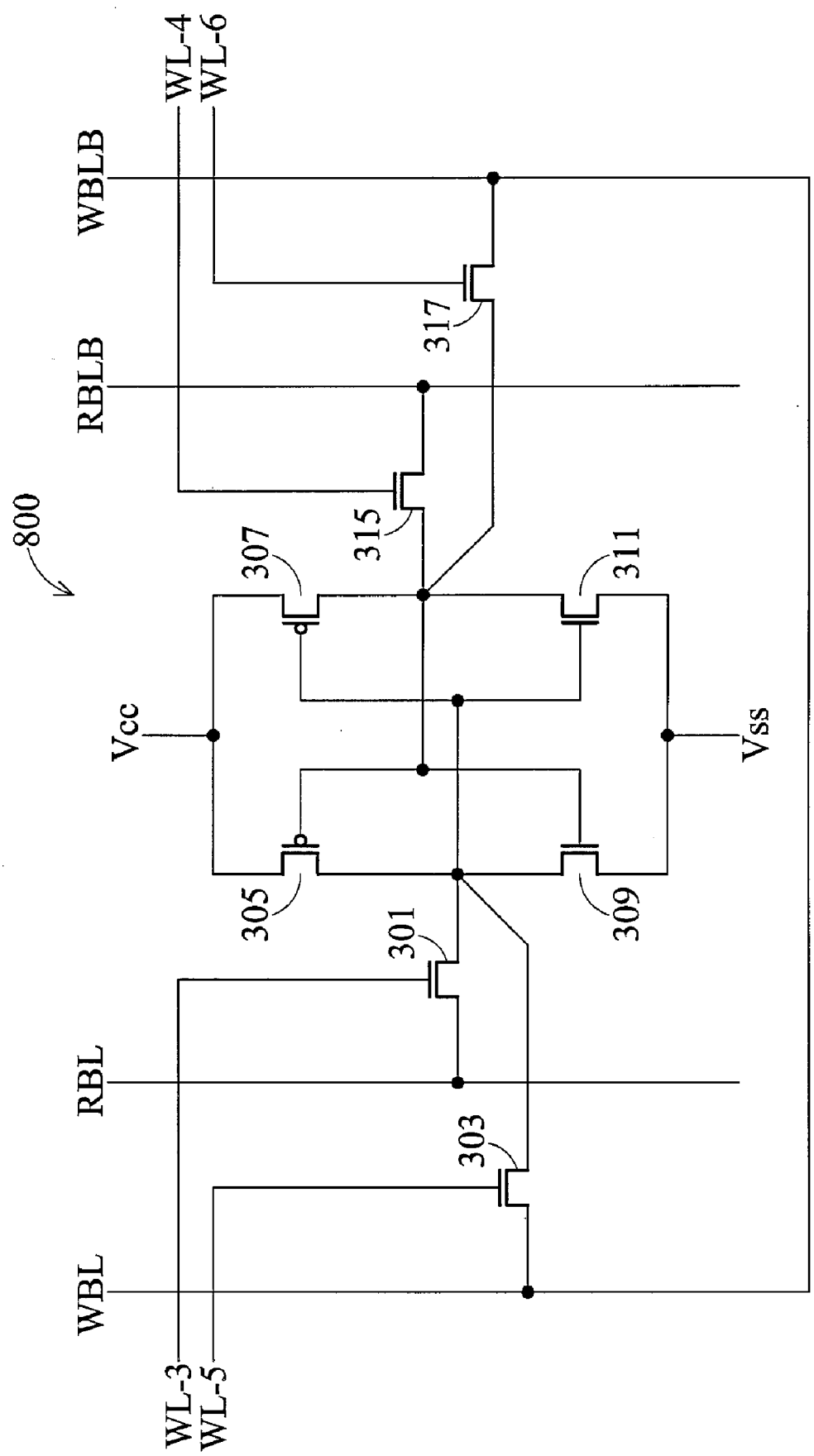
FIG. 8 is a schematic diagram of the pseudo 6T SRAM in which the first pass-gate transistor, second pass-gate transistor, third pass-gate transistor, and fourth pass-gate transistor are all connected to separate word lines in accordance with an embodiment of the present invention.

FIG. 8 is a schematic diagram of a pseudo 6T SRAM memory cell 800, in accordance with a fourth embodiment of the present invention. In this embodiment the gates of all of the pass-gate transistors are connected to separate word lines. The gate of the first pass-gate transistor 301 is connected to a third word line WL-3, the gate of the second pass-gate transistor 315 is connected to a fourth word line WL-4, the gate of the third pass-gate transistor 303 is connected to a fifth word line WL-5, and the gate of the fourth pass-gate transistor 317 is connected to a sixth word line WL-6.

The overlay view of this memory cell 800 is similar to the embodiment described above with reference to FIG. 6, except that in memory cell 800 the gate 441 of the first pass-gate transistor is connected to the third word line WL-3 through a plug 431, the gate 607 of the second pass-gate transistor 315 is connected to the fourth word line WL-4 through a plug 601, the gate 605 of the third pass-gate transistor 303 is connected to the fifth word line WL-5 through a plug 603, and the gate 447 of the fourth pass-gate transistor 317 is connected to the sixth word line WL-6 through a plug 437.

In this embodiment the memory device 800 is written to by applying a high voltage to the third word line WL-3, the fourth word line WL-4, the fifth word line WL-5, and the sixth word line WL-6 to turn on the first pass-gate transistor 301, the second pass-gate transistor 315, the third pass-gate transistor 303, and the fourth pass-gate transistor 317, respectively. Alternatively, only the third word line WL-3 and the fifth word line WL-5 could have a high voltage applied to them, while putting a low voltage on the fourth word line WL-4 and the sixth word line WL-6. With the desired pass-gate transistors open, the write bit line WBL, the complementary write bit line WBLB, the read bit line RBL and the complementary read bit line WRBL can be used to write to the memory device 800.

To read from this embodiment, a high voltage is applied to the third word line WL-3, the fourth word line WL-4, the fifth word line WL-5, and the sixth word line WL-6 to turn on the first pass-gate transistor 301, the second pass-gate transistor 315, the third pass-gate transistor 303, and the fourth pass-gate transistor 317. Alternatively, only the third word line WL-3 and the fifth word line WL-5 could have a high voltage applied to them, while leaving the fourth word line WL-4 and the sixth word line WL-6 with a low voltage. With the desired pass-gate transistors open, the read bit line RBL and the complementary read bit line RBLB can be used to read the memory device 800. The write bit line WBL and complementary write bit line WBLB, while not necessary to read from the device, may also be used to read from the memory device 800 in this embodiment.

As one of ordinary skill in the art will appreciate, in the present invention the read margin of the first embodiment is about 280 (which is approximately a 27% improvement over the prior art 6T configuration and the 8T configuration). Also, the write margin of the present invention is approximately 450, which is approximately an 18% improvement over the prior art. These combine to reduce the $V_{cc,min}$ from $0.85V_{cc}$ in the prior art to $0.78V_{cc}$. Further, these improvements come at no cost in the size of the memory cell, since the cell remains at a size of approximately 0.35 $\mu m^2$, similar to the prior art 6T configuration.

Although the present invention and its advantages have been described in detail, it should be understood that various changes, substitutions and alterations can be made herein without departing from the spirit and scope of the invention as defined by the appended claims. For example, there are multiple methods for the formation of transistors. Any of these methods of formation that achieve substantially the same result as the corresponding embodiments described herein may be utilized according to the present invention.

Moreover, the scope of the present application is not intended to be limited to the particular embodiments of the methods described in the specification. As one of ordinary skill in the art will readily appreciate from the disclosure of the present invention, methods presently existing, or later to be developed, that perform substantially the same function or achieve substantially the same result as the corresponding embodiments described herein may be utilized according to the present invention. Accordingly, the appended claims are intended to include within their scope such methods.

What is claimed is:

1. A semiconductor device comprising:
    a substrate having a first active area, a second active area, a third active area, and a fourth active area;
    a first pull-up transistor in the second active area, the first pull-up transistor having a source electrically coupled to a voltage source and having a drain;
    a first pull-down transistor in the first active area, the first pull-down transistor having a source electrically coupled to a ground, having a drain electrically coupled to the drain of the first pull-up transistor, and having a gate;
    a second pull-up transistor in the third active area, the second pull-up transistor having a source electrically coupled to a voltage source, having a drain, and having a gate;
    a second pull-down transistor in the fourth active area, the second pull-down transistor having a source electrically coupled to a ground, having a drain electrically coupled to the drain of the second pull-up transistor, and having a gate;
    wherein the drain of the first pull-up transistor and the drain of the first pull-down transistor are electrically coupled to the gate of the second pull-up transistor and the gate of the second pull-down transistor, and the drain of the second pull-up transistor and the drain of the second pull-down transistor are electrically coupled to the gate of the first pull-up transistor and the gate of the first pull-down transistor;
    a first bit line and a first complementary bit line;
    a second bit line and a second complementary bit line;
    a first pass-gate transistor in the first active area, the first pass-gate transistor having a first beta ratio, having a source connected to the first bit line, having a drain connected through the first active area to the drain of the first pull-down transistor, and having a gate;

a second pass-gate transistor in the fourth active area, the second pass-gate transistor having a second beta ratio, having a source connected to the first complementary bit line, having a drain electrically coupled through the fourth active area to the drain of the second pull-down transistor, and having a gate;

a third pass-gate transistor in the first active area, the third pass-gate transistor having a third beta ratio that is different from the first beta ratio, having a source connected to the second bit line, having a drain electrically coupled through the first active area to the drain of the first pull-down transistor, and having a gate; and a fourth pass-gate transistor in the fourth active area having a fourth beta ratio that is different from the second beta ratio, having a source connected to the second complementary bit line, having a drain electrically coupled through the fourth active area to the drain of the second pull-down device, and having a gate.

2. The semiconductor device of claim 1, wherein the first beta ratio is less than the third beta ratio.

3. The semiconductor device of claim 1, wherein the second beta ratio is less than the fourth beta ratio.

4. The semiconductor device of claim 1, further comprising a first word line electrically coupled to the gate of the first pass-gate transistor, the gate of the second pass-gate transistor, the gate of the third pass-gate transistor, and the gate of the fourth pass-gate transistor.

5. The semiconductor device of claim 1, wherein the first pass-gate transistor and the third pass-gate transistor share a common gate and the second pass-gate transistor and the fourth pass-gate transistor share a common gate.

6. The semiconductor device of claim 1, further comprising a first word line electrically coupled to the first pass-gate transistor and the second pass-gate transistor and a second word line electrically coupled to the third pass-gate transistor and the fourth pass-gate transistor.

7. The semiconductor device of claim 1, wherein the first active area has a first wide area and two protrusions extending from the first wide area that are substantially parallel to the longitudinal axis of the second active area, and wherein the fourth active area has a second wide area and two protrusions extending from the second wide area that are substantially parallel to the longitudinal axis of the third active area.

8. The semiconductor device of claim 1, further comprising a first write transistor electrically coupled to the second bit line and the second complementary bit line.

9. An SRAM cell comprising:

a first active area with a first wide area and two protrusions extending from the first wide area;

a second active area having a longitudinal axis substantially parallel to a longitudinal axis of the protrusions from the first wide area;

a third active area with a second wide area and two protrusions extending from the second wide area;

a fourth active area having a longitudinal axis substantially parallel to a longitudinal axis of the protrusions from the second wide area;

a first pull-up transistor in the second active area, the first pull-up transistor having a source connected to a voltage source, and having a drain and a gate;

a first pull-down transistor in the first active area, the first pull-down transistor having a source connected to a ground, and having a drain and a gate;

a second pull-up transistor in the fourth active area, the second pull-up transistor having a source connected to a voltage source and having a drain and a gate;

a second pull-down transistor in the third active area having a source connected to a ground and having a drain and a gate;

wherein the drain of the first pull-up transistor and the first pull-down transistor are electrically coupled to the gates of the second pull-up transistor and the second pull-down transistor, and the drain of the second pull-up transistor and the second pull-down transistor are electrically coupled to the gate of the first pull-up transistor and the first pull-down transistor to form a pair of cross-coupled inverters;

a first pass-gate transistor in the first active area, the first pass-gate transistor comprising a source, a gate, and a drain, the first pass-gate transistor having a first beta ratio, and the drain being electrically coupled through the first active area to the drain of the first pull-down transistor;

a second pass-gate transistor in the third active area, the second pass-gate transistor comprising a source, a gate, and a drain, the second pass-gate transistor having a second beta ratio, and the drain being electrically coupled through the third active area to the drain of the second pull-down transistor;

a third pass-gate transistor in the first active area, the third pass-gate transistor comprising a source, a gate, and a drain, the drain being electrically coupled through the first active area to the drain of the first pull-down transistor, and the third pass-gate transistor having a third beta ratio that is larger than the first beta ratio;

a fourth pass-gate transistor in the third active area, the fourth pass-gate transistor comprising a source, a gate, and a drain, the drain being electrically coupled through the third active area to the drain of the second pull-down transistor, and the fourth pass-gate transistor having a fourth beta ratio that is larger than the second beta ratio;

a first bit line electrically coupled to the source of the first pass-gate transistor;

a first complementary bit line electrically coupled to the source of the second pass-gate transistor;

a second bit line electrically coupled to the source of the third pass-gate transistor;

a second complementary bit line electrically coupled to the source of the fourth pass-gate transistor;

wherein the larger beta ratio of either the first pass-gate transistor or the third pass-gate transistor acts as a "write" port, and the smaller beta ratio acts as a "read" port; and wherein the larger beta ratio of either the second pass-gate transistor or the fourth pass-gate transistor acts as a "write" port, and the smaller beta ratio acts as a "read" port.

10. The SRAM cell of claim 9, further comprising a first word line electrically coupled to gate of the first pass-gate transistor, the gate of the second pass-gate transistor, the gate of the third pass-gate transistor, and the gate of the fourth pass-gate transistor.

11. The SRAM cell of claim 9, wherein the first pass-gate transistor and the third pass-gate transistor share a common gate, and the second pass-gate transistor and the fourth pass-gate transistor share a common gate.

12. The SRAM cell of claim 9, further comprising a first word line electrically coupled to the first pass-gate transistor and the second pass-gate transistor, and a second word line electrically coupled to the third pass-gate transistor and the fourth pass-gate transistor.

13. The SRAM cell of claim 9, further comprising a first write transistor electrically coupled to the second bit line and the second complementary bit line.

14. A semiconductor memory circuit comprising:
a plurality of memory cells, each memory cell comprising:
a substrate with a first active area, a second active area, a third active area, and a fourth active area;
a first inverter;
a second inverter cross-coupled with the first inverter;
a first bit line and a first complementary bit line;
a second bit line and a second complementary bit line;
a first word line;
a second word line;
a third word line;
a fourth word line;
a first pass-gate transistor in the first active area, the first pass-gate transistor having a source connected to the first bit line, having a drain connected through the first active area to the first inverter, and having a gate connected to the first word line;
a second pass-gate transistor in the fourth active area, the second pass-gate transistor having a source connected to the first complementary bit line, having a drain electrically coupled through the fourth active area to the second inverter, and having a gate connected to the second word line;
a third pass-gate transistor in the first active area, the third pass-gate transistor having a source connected to the second bit line, having a drain electrically coupled through the first active area to the first inverter, and having a gate connected to the third word line; and
a fourth pass-gate transistor in the fourth active area having a source connected to the second complementary bit line, having a drain electrically coupled through the fourth active area to the second inverter, and having a gate connected to the fourth word line.

15. The semiconductor memory circuit of claim 14, further comprising a first write transistor electrically coupled to the second bit line and the second complementary bit line.

16. The semiconductor memory circuit of claim 14, wherein the first pass-gate transistor and the third pass-gate transistor share a common gate.

17. The semiconductor memory circuit of claim 14, wherein the first word line and the third word line each have a high voltage when the memory cell is either being read or written.

18. The semiconductor memory circuit of claim 14, wherein the first word line, the second word line, the third word line, and the fourth word line each have a high voltage when the memory cell is either being read or written.

19. The semiconductor memory circuit of claim 14, wherein the first bit line and second bit line each have a high voltage when the memory cell is either being read or written.

20. The semiconductor memory circuit of claim 14, wherein the first active area has a first wide area and two protrusions extending from the first wide area that are substantially parallel to the longitudinal axis of the second active area, and wherein the fourth active area has a second wide area and two protrusions extending from the second wide area that are substantially parallel to the longitudinal axis of the third active area.

* * * * *